United States Patent
DeHerrera et al.

(10) Patent No.: US 7,333,360 B2
(45) Date of Patent: Feb. 19, 2008

(54) APPARATUS FOR PULSE TESTING A MRAM DEVICE AND METHOD THEREFORE

(75) Inventors: Mark DeHerrera, Tempe, AZ (US); Nicholas Rizzo, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 788 days.

(21) Appl. No.: 10/746,014

(22) Filed: Dec. 23, 2003

(65) Prior Publication Data

US 2005/0133822 A1 Jun. 23, 2005

(51) Int. Cl. *G11C 11/15* (2006.01)
(52) U.S. Cl. ..................................... 365/173
(58) Field of Classification Search ............... 714/718; 365/158, 173; 257/295
See application file for complete search history.

(56) References Cited

U.S. PATENT DOCUMENTS

| | | | |
|---|---|---|---|
| 5,527,110 A * | 6/1996 | Abraham et al. ............... 374/5 |
| 5,702,831 A | 12/1997 | Chen et al. |
| 5,734,605 A | 3/1998 | Zhu et al. |
| 6,127,045 A * | 10/2000 | Gill ............................. 428/611 |
| 6,304,477 B1 | 10/2001 | Naji |
| 6,552,927 B2 | 4/2003 | Naji |
| 6,775,183 B2 * | 8/2004 | Heide .......................... 365/173 |
| 6,778,432 B2 * | 8/2004 | Ohtani ......................... 365/171 |
| 6,873,543 B2 * | 3/2005 | Smith et al. ................. 365/158 |

* cited by examiner

*Primary Examiner*—James C. Kerveros
(74) *Attorney, Agent, or Firm*—Ingrassia, Fisher & Lorenz, P.C.

(57) ABSTRACT

Methods and apparatus are provided for testing a magnetoresistive random access memory (MRAM). A magnetoresistive tunnel junction (MTJ) has a first terminal, a second terminal, and a third terminal. A source measuring unit is coupled to a first terminal of a MTJ to provide DC biasing. A current preamp has an input coupled to a third terminal of the MTJ for receiving current corresponding to a resistance of the MTJ. A pulse generator is AC coupled to the MTJ for programming the MTJ. A method of insitu testing a MTJ in a manufacturing environment uses a probe station coupled to the MTJ. A probe station couples to the MTJ. The MTJ is DC biased for generating a current corresponding to the logic level stored in the MTJ. A pulse for programming the MTJ is AC coupled to the MTJ.

23 Claims, 3 Drawing Sheets

APPARATUS FOR PULSE TESTING A MRAM DEVICE AND METHOD THEREFORE

TECHNICAL FIELD OF THE INVENTION

The present invention generally relates to testing of semiconductor integrated circuits, and more particularly relates to testing magnetoresistive random access memories (NRAMs).

BACKGROUND OF THE INVENTION

Memories comprise one of the largest markets for semiconductor integrated circuits. In general, a memory is a storage device that retains information or data that can be output when needed. Memory devices are often characterized under such names as high speed, high density, or non-volatile memories. A high speed memory, as its name implies is a device having extremely fast read/write times that are useful in situations where data transfer rates are critical. A high density memory has a substantial memory size for large storage capability. The most common high density solid state memory is a dynamic random access memory (DRAM). A non-volatile memory is a memory that retains information even when power is removed and is thereby a permanent storage medium. A common non-volatile memory is FLASH memory. In general, an ideal memory has characteristics of all of the above mentioned types of memory.

As mentioned previously, the most widely used non-volatile memory is FLASH memory. FLASH memory uses charge storage in a floating gate to retain information. FLASH memories operate at relatively high voltages, running counter to the trend of reducing power supply voltages for other high density integrated circuits. Moreover, they have slow program and erase times. The ability to write or store charge in the floating oxide is limited to a finite number of times that can be exceeded depending on the application. Memory failure occurs if the maximum number of writes is exceeded. FLASH memory is limited for high density applications because it cannot be continually scaled to smaller dimensions due to gate oxide limitations.

Another type of non-volatile memory is a magnetoresistive random access memory (MRAM). MRAM is a viable memory type for the future because it is a high density memory, scalable, low voltage, low power consumption, and high speed read/write times. A magnetoresistive memory cell comprises a magnetic tunnel junction (MTJ) and includes ferromagnetic layers separated by an insulating dielectric. Electrons tunnel through the dielectric, known as the tunnel barrier, from a first ferromagnetic layer to a second ferromagnetic layer. The direction of the magnetization vectors in the ferromagnetic layers determines the tunneling resistance. A zero logic state is represented when the magnetization directions are parallel which corresponds to a low tunneling resistance for the magnetic tunneling junction. Conversely, a one logic state is represented when the magnetization states are anti-parallel which corresponds to a high tunneling resistance. Typically, a magnetic vector in one magnetic layer is fixed or pinned, while the magnetization direction of the other magnetic layer is free to switch between the same and opposite (anti-parallel) directions. The memory is non-volatile because the ferromagnetic material holds the magnetization vectors when the memory is not powered. It should be noted that the selection of the parallel state or the anti-parallel state as a logic one or zero state is arbitrary.

In a common MRAM architecture, each memory cell of an array of memory cells is located at the intersections of an orthogonal array of conductive lines. A bit line is generally associated with each column of an array of MRAM cells and a digit line is associated with each row of MRAM cells in the array. In general, programming or writing to a selected cell is accomplished by passing predetermined currents through the digit and bit lines intersecting at the selected cell. The currents create a magnetic field that sets the magnetic vector in the free layer to a desired position. Reading the state of a MRAM cell is accomplished by detecting a resistance of the magnetic tunnel junction (MTJ). For example, the MRAM cell is biased at a predetermined voltage, the magnitude of the current through the MRAM cell corresponds to the resistance value of the device. Thus, the two different resistive values of the MRAM cell that directly relates to a stored parallel or anti-parallel magnetization vector can be converted to a corresponding digital logic level.

In general, MRAM cells are formed in a CMOS wafer process. In many MRAM architectures, each memory cell has at least one CMOS transistor coupled in series to the cell. In development or production manufacturing it is beneficial to be able to rapidly characterize and optimize memory cells with the supporting CMOS circuitry. This is especially true when the goal is the characterization of the MRAM cell itself and not other circuitry associated with the memory. The cost to process wafers to a finished level is expensive because of the number of masks and wafer processing steps required in a complex CMOS wafer process flow. Moreover, in the development phase, different materials or different cell structures are routinely produced that if processed using the entire process flow would have substantial manufacturing cycle time. Long term, it is beneficial to have the capability to perform on chip testing of MRAM cells during wafer processing and at wafer probe to generate insitu processing data.

Accordingly, it is desirable to provide a test apparatus for characterizing a MRAM cell. In addition, it is desirable to reduce the cost to develop MRAM cells. It would be of further benefit to provide a test methodology to characterize MRAM cells in a production environment. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

Figure 1:
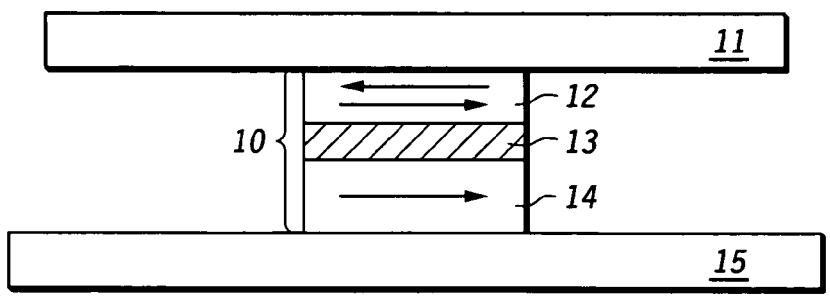
FIG. 1 is a cross-sectional view of a magnetic tunnel junction (MTJ) cell in accordance with the present invention.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

A typical architecture of a magnetoresistive random access memory (MRAM) comprises an array of magnetic tunnel junction (MTJ) cells and CMOS circuitry to read and write to the memory array. Each MTJ cell is located at a unique intersection of a particular bit line and digit line in the memory array. The bit lines and digit lines respectively correspond to column and row lines of more common memory types. Programming of a MTJ cell is achieved by passing current pulses through the bit line and the digit line that intersect at the MTJ cell. The magnetic fields generated by the current pulses in the bit line and the digit line are coupled to a free magnetic layer of the MTJ cell and are designed to have a sufficient magnitude to program the magnetic vector stored therein. The current magnitudes are selected such that a pulse on only one of the lines (bit line or digit line) does not have the magnitude to program the selected MTJ cell nor any other bits coupled to the active bit or digit line. In this example architecture, the digit line does not electrically couple to the MTJ cell but is positioned in a manner where it is only magnetically coupled when it carries a current pulse. The polarity of the current pulses provided to the bit line and the digit line, or the timed sequence of pulses in the bit line and digit line, determine the direction in which the magnetic vector is programmed in the free magnetic layer of the MTJ cell. In general, a transistor is coupled to the MTJ cell. In this example architecture, the transistor is an n-channel field effect transistor. An interconnect stack connects the transistor to the device, which is coupled to the bit line to create the electrical path for reading the resistance of the bit.

The logic state stored in a MTJ cell corresponds to the resistance of the MTJ cell. The resistance is a function of the magnetization direction of the free magnetic layer with respect to the magnetization direction of the fixed magnetic layer. The MTJ cell is in a logic zero state when the magnetization directions are the same (or parallel). Conversely, the MTJ cell is in a logic one state when the magnetization directions oppose one another (anti-parallel). In general, to perform a read on the MTJ cell, the MTJ cell is biased with a predetermined voltage. The bias voltage generates a current through the MTJ cell that corresponds to the resistance of the MTJ cell. The current received from the MTJ cell is then converted to a voltage logic state.

In development it is very beneficial to have the capability to rapidly manufacture and evaluate test chips. In particular, memory cell arrays often go through many manufacturing iterations because the driving force is to reduce memory cell size that often results in wafer processing tolerances being pushed to the limit. Due to the nature of MRAM, it is possible to evaluate the magnetic and electrical properties of the individual bits without having to build them on fully processed and costly CMOS wafers. Therefore, in the development of MRAM, the cost is greatly increased, and perhaps more important, time wasted when manufacturing MRAM test chips that include all the peripheral CMOS circuitry used in the device.

Providing the capability to rapidly process and assess MTJ cells to optimize a wafer process or magnetic material properties can greatly reduce the time to market. The ability to rapidly test MTJ cells is not only useful in a development environment but also in a manufacturing environment. It is beneficial to be able to take measurements on MTJ cells during wafer processing and upon completion of wafer processing in wafer form (before dicing). The status of the wafer processing could be determined and corrected or terminated before all the expense has been incurred should it be found out of specification.

An important aspect of characterizing the magnetic material is measuring its response to high-speed current pulses similar to the conditions it would experience in the full memory array. The typical test sequence in an actual memory array with CMOS drivers comprises pulsing every bit in the array using the bit and digit lines with the read transistors disabled. Each bit is then read by enabling the corresponding read transistor of the cell to determine if the cell switched state. Reading individual cells can be performed at megahertz speeds because the read circuitry is local to the corresponding memory cell. In performing high-speed testing on a full MRAM circuit, a statistically significant number of switching events can be performed in a short span of time by switching and reading thousands or millions of bits at chip operating speeds.

There are several drawbacks to relying on full memory arrays to gather high-speed switching statistics. As previously mentioned, fully processed CMOS wafers are expensive and take a significant time to wafer process. Relying on fully processed CMOS wafers may be cost and time prohibitive if it is necessary to quickly evaluate many different materials or varying process conditions. Also, complete MRAM arrays may be restricted in the waveform, timing, amplitude, or other important variables related to the pulse stimuli being evaluated. Furthermore, memory test systems are expensive and difficult to maintain and they require specific knowledge to program or configure for specialized experiments.

It is for these reasons that it is beneficial to have the capability to generate statistically significant high-speed MTJ switching data on wafers processed with only a few masking steps. However, since there is no CMOS addressing available on such wafers, each bit to be tested has electrical contact points that can be contacted by the test equipment. For example, a probe station could be used to couple the electrical contact points of the MTJ cell to test equipment. Test time would be efficiently utilized by maximizing the number of write and read cycles performed on a given bit within a given test period.

FIG. 1 is a cross-sectional view of a magnetic tunnel junction (MTJ) memory cell 10 in accordance with the present invention. MTJ memory cell comprises a magnetic layer 12, an insulating layer 13, and magnetic layer 14. Magnetic layers 12 and 14 comprise a ferromagnetic material (or a combination of materials) such as nickel, iron, or cobalt. The insulating layer 13 (or tunnel barrier) comprises an insulating material such as aluminum oxide. The ferromagnetic material used in magnetic layers 12 and 14 have magnetic vectors pointing in a specific direction. In general, one layer, for example magnetic layer 14 is a pinned layer having a magnetic vector pointed in a fixed direction that does not change during a read or write cycle. The magnetic vector is indicated by the arrow in magnetic layer 14. The other magnetic layer (magnetic layer 12) has a magnetic vector that is free to be programmed in two directions. This is indicated by the two arrows in magnetic layer 12. Note that the one arrow in magnetic layer 12 points in the same direction as the arrow in magnetic layer 14 while the other arrow in magnetic layer 12 points in the opposite direction as the arrow in magnetic layer 14. Magnetic vectors in MTJ cell 10 pointed in the same direction are described as being parallel while magnetic vectors in the opposite direction are known as being anti-parallel.

The stored logic state is determined by sensing a resistance of MTJ cell 10. In general, a bias voltage is applied across MTJ cell 10 that generates a current that corresponds to the resistance of MTJ cell 10. In particular, a minimum resistance occurs when the magnetic vectors in magnetic layers 12 and 14 are aligned parallel to one another. The parallel magnetic vectors increase the tunneling current through MTJ cell 10 (lower resistance state). Conversely, a maximum resistance occurs when the magnetic vectors in magnetic layers 12 and 14 are anti-parallel or opposed to one another. The anti-parallel magnetic vector decreases tunneling through MTJ cell 10 (high resistance state).

As shown, MTJ cell 10 is coupled to an interconnect 11 that couples to magnetic layer 12 and an interconnect 15 that couples to magnetic layer 14. An interconnect (not shown) resides in proximity to MTJ cell 10 for conducting a current pulse to program magnetic layer 12. Interconnect 11 and the interconnect in proximity to MTJ cell 10 conduct a current pulse that generates a magnetic field that couples to, and sets a magnetic vector of magnetic layer 12. Interconnects 11 and 15 are used to couple a DC bias voltage across MTJ cell 10 to generate a current through the device that corresponds to the stored logic level.

MTJ cell 10 can be wafer processed with interconnect 11 using as few as two mask layers when no CMOS devices are required to be formed. This is highly advantageous because a memory array can be wafer processed and tested in a cycle that takes days or weeks instead of months. There are substantial issues in testing a MTJ cell with an interconnect that couples both electrically and magnetically to the MTJ cell. Without benefit of an isolation device on the wafer, the large currents necessary to generate the magnetic fields to switch the free magnetic layer often causes damage in the device. The tunnel barrier of a MTJ cell is very thin and sensitive to voltage. For example, MTJ cells that are currently being wafer processed can be permanently damaged if the voltage applied across the device exceeds two volts. Disclosed hereinbelow is a test system capable of rapid and complete testing of MTJ cell 10 (no CMOS circuitry) without damage to the device.

Figure 2:
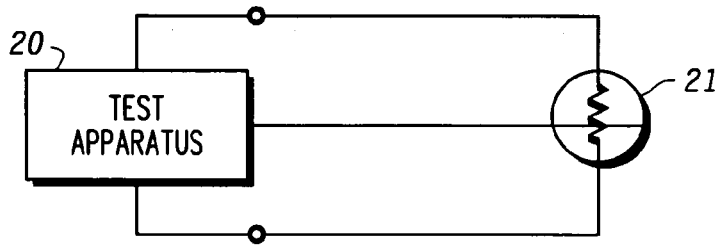
FIG. 2 is a simplified diagram of a test apparatus in accordance with the present invention.

FIG. 2 is a simplified diagram of a test apparatus 20 in accordance with the present invention. Test apparatus 20 has three terminals for coupling to a magnetic tunnel junction (MTJ) cell 21. In one embodiment, test apparatus 20 is coupled or integrated with a probe station. The probe station has at least three probes for contacting magnetic tunneling junctions on a semiconductor wafer which allows rapid testing of the devices. Thus, testing of magnetic tunnel junctions can be performed during manufacture or at wafer probe. This is very useful for monitoring the status of the wafer process. Test apparatus 20 can pulse MTJ cell 21 to set the magnetic vector in either direction. Test apparatus 20 also provides a DC voltage bias across MTJ cell 21 to generate a current corresponding to the resistance of the device. The sensed current magnitude is then converted to a logic level. Moreover, MTJ cell 21 can be characterized by varying the test conditions of the cell. Test apparatus 20 includes equipment to monitor conditions that occur at different terminals of MTJ cell 21.

Figure 3:
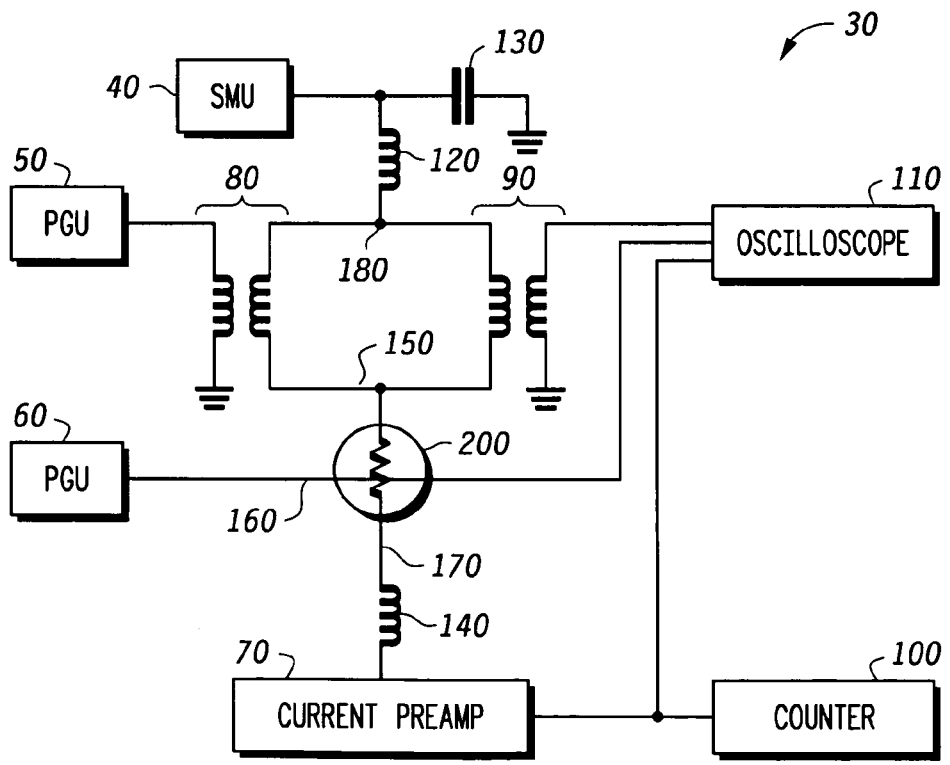
FIG. 3 is a test apparatus in accordance with the present invention.

FIG. 3 is a test apparatus 30 in accordance with the present invention. Test apparatus 30 comprises a source measure unit 40 (SMU), a pulse generator unit (PGU) 50, a pulse generator unit (PGU) 60, a current preamp 70, a transformer 80, and a transformer 90. A device under test or MTJ cell 200 has a terminal 150, a terminal 160, and a terminal 170. Terminal 150 is coupled to a first magnetic layer of MTJ cell 200. Terminal 170 is coupled to a second magnetic layer of MTJ cell 200. Terminal 160 is an interconnect that is in proximity to MTJ cell 200. Terminal 160 is not electrically coupled to MTJ cell 200 but generates a magnetic field when conducting a current pulse that couples to the free magnetic layer of MTJ cell 200.

Transformer 80 has a first input, a second input coupled to ground, a first output coupled to a node 180, and a second output coupled to terminal 150 of MTJ cell 200. The first and second inputs correspond to a first winding of transformer 80. The first and second outputs correspond to a second winding of transformer 80. Pulse generator unit 50 has an output coupled to the first input of transformer 80. Pulse generator unit 60 has an output coupled to terminal 160 of MTJ cell 200. Current preamp 70 has an input coupled to terminal 170 of MTJ cell 200. Transformer 90 has a first input coupled to node 180, a second input coupled to terminal 150 of MTJ cell 200, a first output, and a second output coupled to ground. In an embodiment of test apparatus 30, the first output of transformer 90 couples to an oscilloscope 110 for monitoring the test. The first and second inputs of transformer 90 correspond to a first winding of transformer 90. The first and second outputs of transformer 90 correspond to a second winding of transformer 90.

Source measuring unit 40 couples to terminal 150 respectively through the second and first windings of transformers 80 and 90. A DC current path is formed through the following devices: source measuring unit 40, the second winding of transformer 80, the first winding of transformer 90, MTJ cell 200, and current preamp 70. Source measuring unit 40 provides a DC bias voltage on MTJ cell 200. The second and first windings respectively of transformers 80 and 90 is a wire or wired connection coupling the output of source measuring unit 40 to terminal 150. Current preamp 70 acts as a virtual ground to the DC current path. Thus, the DC bias voltage provided by source measuring unit 40 is across MTJ cell 200. The bias voltage provided across MTJ cell 200 by source measuring unit 40 is approximately constant for either stored logic level and under various test operations.

In an embodiment of test apparatus 30, the bias voltage across MTJ cell 200 is provided continuously during both read and write operations. The DC bias voltage across MTJ cell 200 is kept at a voltage level that allows safe operation such that the sensitive material layers that comprise the magnetic tunneling junction are not compromised during testing. For example, the bias voltage is typically kept at a voltage substantially less than a voltage at which device breakdown occurs. For example, MTJ cell 200 sustaining damage at voltages greater than 2 volts would be operated with a bias voltage less than 1 volt, and preferably at approximately 0.5 volts to ensure safe operation of the structure.

Current preamp 70 receives the current corresponding to a logic level stored in MTJ cell 200 and amplifies and converts the current to a detectable signal. In general, current preamp 70 converts current in the microampere range to a voltage signal on the order of hundreds of millivolts. A major benefit of using current preamp 70 is that it increases an operating speed of test apparatus 30. In an alternate embodiment, the bit resistance change would be detected by sensing changes in voltage across the bit at terminal 150 if SMU 40 were in a constant current mode. The time for a voltage change to occur is limited by the RC time constant of the system, where R is the resistance of the bit and C is the capacitance of the interconnects and cabling. For example, a time constant of 2 µs occurs with a resistance of 20 kΩ and a capacitance of 100 pf due to a length of coaxial cable. The maximum operating frequency is approximated using 3 time constants (6 µs) which yields a frequency of 50 kHz or less. By operating SMU 40 in constant voltage, current preamp 70 is used in a mode where the RC time constant of the system is set by the gain resistor R in the preamp and the capacitance C of the preamp. Typical read detection frequencies are in the range of 250 kHz to 500 kHz using a preamp gain of approximately 10 µA/V. Operating current preamp 70 in a constant current mode would greatly slow down a read operation due to capacitive charging. In general, current preamp 70 converts current in the microampere range to a voltage signal on the order of hundreds of millivolts.

In an embodiment of test apparatus 30, an input of a counter 100 is coupled to an output of current preamp 70. A trigger level of counter 100 is set to the midpoint between the voltage outputs of current preamp 70 corresponding to the two different logic levels (low and high resistance states) of MTJ cell 200. A count of counter 100 is incremented when the output of current preamp 70 transitions through the trigger level.

Performance of the circuitry that provides the DC bias voltage to MTJ cell 200 is further enhanced by an inductor 120, an inductor 140, and a capacitor 130. In general, an inductor is a short circuit at DC and an open circuit at high frequencies. Inductor 120 has a first terminal coupled to the output of source measuring unit 40 and a second terminal coupled to node 180. Inductor 120 prevents programming pulses provided to MTJ cell 200 from entering or affecting source measuring unit 40. Inductor 120 also prevents electrostatic discharge (ESD) from being coupled from test apparatus 30 to MTJ cell 200. Capacitor 130 has a first terminal coupled to the output of source measuring unit 40 and second terminal coupled to ground. Capacitor 130 is a short circuit to high frequency signals. Capacitor 130 further isolates source measuring unit 40 from disturbances that are generated by changes in MTJ cell 200 during testing. Inductor 140 has a first terminal coupled to terminal 170 and a second terminal coupled to the input of current preamp 70. Inductor 140 minimizes spurious current changes that are generated when current pulses pass through terminal 150 and subsequently MJT cell 200. Inductor 140 also prevents electrostatic discharge from being coupled from test apparatus 30 to MTJ cell 200.

Pulse generator units 50 and 60 pulse MTJ cell 200 to set a magnetic vector in the free magnetic layer of the device. In particular, pulsing MTJ cell 200 is done in a manner that does not create a damaging voltage across the device. Also, the methodology for pulsing MTJ cell 200 allows MTJ cell to be continuously DC biased. In general, current pulses are provided to terminals 150 and 160 of MTJ cell 200 that generates a magnetic field that is coupled to a free magnetic layer of the device. The combined magnetic field generated by the current pulses has sufficient magnitude to set the magnetic vector of the free magnetic layer.

As mentioned previously, MTJ cell 200 has a DC bias voltage across it provided by source measuring unit 40. The DC bias voltage remains substantially constant during both read and write operations of test apparatus 30. In general, the DC electrical resistance from one coil of a transformer to the other coil of a transformer is treated as an electrical open circuit Therefore, the DC bias voltage can be continuously provided to MTJ cell 200 during both read and write operations through the second winding of transformer 80 coupled to the first winding of transformer 90 because transformers 80 and 90 isolate the DC bias voltage from the output of PGU 50 and oscilloscope 110. The DC bias voltage is isolated from PGU 50 to prevent interference with the operation of PGU 50. Similarly, the isolation prevents the output resistance of PGU 50 from being read in combination with the resistance of MTJ 200 thereby affecting reading of the stored logic level.

The AC electrical resistance from one coil of a transformer to the other coil of a transformer is treated as an electrical short circuit. A conductive loop comprises the second winding of transformer 80 coupled to the first winding of transformer 90. The conductive loop formed by transformers 80 and 90 is a complete low resistance circuit path that allows a pulse output from pulse generator unit 50 to pass through terminal 150 of MTJ cell 200. The current pulse conducted through terminal 150 generates the magnetic field that couples to the free magnetic layer of MTJ cell 200. The effective resistance parallel to MTJ cell 200 seen by the current pulse is the resistance of the conductive loop which is a low or negligible resistance. Therefore, little or no current of the current pulse is conducted through MTJ cell 200 and the voltage across the device is unchanged. Thus, a large current pulse can be provided to MTJ cell 200 without fear of damaging the sensitive layers of the device. Experimental evidence proves the validity of the above described concept. Voltage pulses higher than 6 volts have been applied without damaging the MTJ cell under test using this test configuration. The breakdown voltage of the MTJ cell being tested was 2 volts.

The current pulse provided by the second winding of transformer 80 couples through terminal 150 and the first winding of transformer 90. The first winding of transformer 90 is magnetically coupled to a second winding of transformer 90 which is used to monitor the current pulse. In an embodiment of test apparatus 30, the first and second output of transformer 90 corresponds to the second winding and is respectively coupled to a first input of an oscilloscope 110 and ground. Thus, a pulse from pulse generator unit 50 can be monitored by oscilloscope 110 without direct electrical connection to MTJ cell 200.

Transformers 80 and 90 allow a DC bias to be applied to MTJ cell 200 while simultaneously providing a current pulse for programming the device. As described hereinabove, it can be accomplished without damaging the sensitive structure of a magnetic tunneling junction. The current pulsing is provided at very high speeds which relates to the fast read and write times needed for taking large data samples when characterizing MTJ cell 200. As mentioned previously, the read speed is greatly increased through the use of current preamp 70. The speed of the current pulses used for writing is related to the transformers being used. For example, transformers are typically optimized for operating within a specific frequency band. In an embodiment of test apparatus 30, transformers with a bandpass range from 10 kHz to 400 MHz are used for coupling a current pulse of nanosecond duration that corresponds to a normal operating speed of a memory for testing MTJ cell 200 at speeds exceeding 500 kHz.

Prior art testing would require that the DC bias to MTJ cell 200 be removed before a pulse is provided for programming the device. Removing the DC bias in prior art test configurations prevented interactions between the DC bias and the pulse generator unit. Also, the DC bias and the pulse were problematic because in the prior art configuration the voltages added which could exceed the breakdown limit of the device. Furthermore, switching the DC bias on and off as done in the prior art introduces a delay or settling time to stabilize the test set up which slows down testing or increases the risk of erroneous measurements. All of these limitations are circumvented by test apparatus 30.

Typically, it is useful to test MTJ cell 200 using pulses generated by two programming lines as would be seen in an actual memory array. Pulse generator unit 60 provides a pulse concurrently with pulse generator unit 50. Note that pulse generator unit 60 is not coupled to MTJ cell 200 through a transformer. Terminal 160 of MTJ cell 200 is not electrically coupled to the device. Thus, the pulse provided by pulse generator unit 60 cannot damage MTJ cell 200 and the use of transformers is not required. Oscilloscope 110 has a second input coupled to the output of pulse generator unit 60 and a third output coupled to the output of current preamp 70. Oscilloscope 110 or an equivalent monitoring device is useful in tracking/data logging the input stimulus to the device under test, the logic state stored in the device under test, and the programming of the device under test. It should be noted that oscilloscope 110 does not couple to MTJ cell 200 in a manner that degrades testing of the device.

Referring to FIG. 3, the test apparatus is initialized or calibrated prior to high speed testing. MTJ cell 200 is switched between a low and high resistance state using an external magnetic field or by applying large pulses in the current carrying lines. One reason for this preliminary testing is to ensure that the device can store information in either logic state and to set up the test equipment. Current preamp 70 is then offset adjusted such that the output of current preamp 70 is zero volts when MTJ cell 200 is in a high resistance state (low sense current). The current preamp 70 then outputs a voltage magnitude greater than zero volts when the MTJ cell is in a low resistance state (high sense current). The trigger level of counter 100 is then set to a midpoint between the output voltage of current preamp 70 for the high and low resistance states of MTJ cell 200. The line resistance is then calibrated by applying a series of pulses of known amplitude to each current carrying line to MTJ cell 200 and reading the results on oscilloscope 110. In an embodiment of test apparatus 30, the maximum operating speed is determined by current preamp 70. In particular, there must be sufficient delay between writing or resetting of MTJ cell 200 to allow the output of current preamp 70 to swing and settle to the correct logic level such that counter 100 is accurately triggered without errors.

Figure 4:
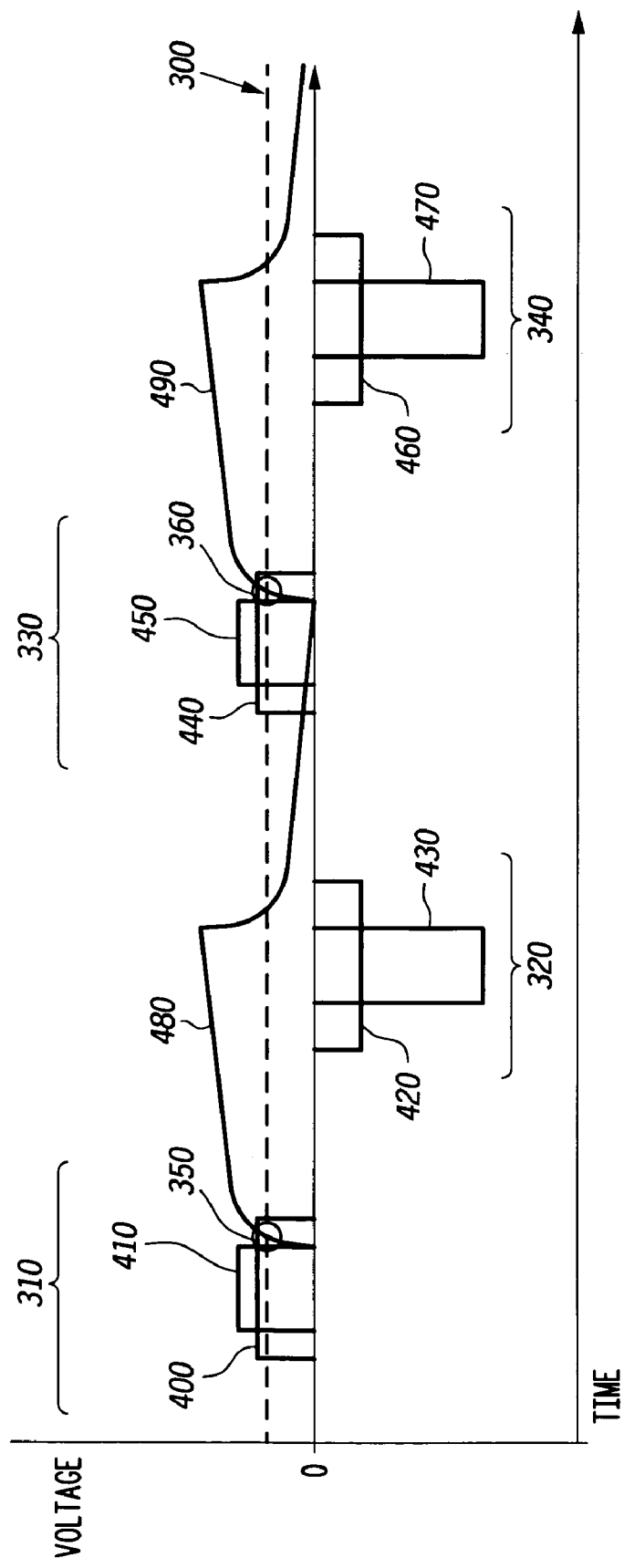
FIG. 4 is an example of a high speed test using the test apparatus of FIG. 3 in accordance with the present invention.

FIG. 4 is an example of a high speed test using test apparatus 30 of FIG. 3 in accordance with the present invention. FIG. 4 is a graph showing a magnetic tunneling junction being pulsed to change a logic state of the cell repetitively. The y-axis is voltage of the pulse and the x-axis is time. The graph shows two pulses in succession being written to the MTJ cell. Rigorous testing and characterization of a magnetic tunnel junction cell requires high counts of reading and writing to the device under various operating conditions. For example, a fast write burst of 10,000 or more pulses at each pulse amplitude will provide excellent statistics for calculating bit switching parameters.

In an embodiment of the testing, the MTJ cell writing and reading process occurs at speeds of 500 KHz or more. This allows a large quantity of data to be rapidly generated for each cell because of the speed at which testing occurs. In the example, four events are shown: an event 310 where MTJ cell 200 of FIG. 3 is programmed to a first logic level, an event 320 where the MTJ cell is reset to a second logic level, an event 330 where the MTJ cell is programmed to the first logic level, and an event 340 where the MTJ cell is reset to the second logic level. In general, this example is a repetitive process of writing and reading the MTJ cell. Many parameters can be varied to characterize the device such as the pulse width or pulse magnitude used for programming the cell.

In FIG. 4 four events (310, 320, 330, and 340) are shown each corresponding to a write and read of the MTJ cell being tested. A trigger voltage 300 is drawn as a dashed line to indicate a point at which counter 100 is incremented which indicates that the MJT cell was programmed correctly. In particular, the case where MTJ cell 200 has parallel magnetic vectors (low resistance) is being evaluated in the example. The output of current preamp 70 transitions from 0V to a maximum voltage corresponding to the current generated by MTJ cell 200 in a low resistance state. As mentioned previously, trigger voltage 300 is centered between 0V and the maximum voltage. The count of counter 100 is incremented when a positive voltage transition exceeds trigger voltage 300.

Prior to event 310, MJT cell 200 was set in a high resistance state (anti-parallel magnetic vectors). In event 310, a pulse 410 and a pulse 400 are respectively provided by pulse generator units 50 and 60. In general, pulse generator units 50 and 60 provide the pulses simultaneously to MTJ cell 200. In an embodiment of the test, pulse 410 is wider than pulse 400. The combined magnitude of the pulses 400 and 410 generate a magnetic field that sets the magnetic vector in the free layer of MTJ cell 200 from anti-parallel to parallel. The lower resistance of MTJ cell 200 causes the output voltage of current preamp 70 to increase in magnitude which is indicated by pulse 480. A count 350 is registered by counter 100 when the output voltage of current preamp 70 exceeds trigger voltage 300. Thus, MTJ cell 200 was successfully programmed for the pulse magnitude and pulse duration provided by pulse generator units 50 and 60.

In event 320, MTJ cell 200 is reset back to a state where the magnetic vectors are anti-parallel. In an embodiment of the test, MTJ cell 200 is not reset until pulse 480 has approximately reached its maximum voltage or the test has stabilized. Pulse generator units 50 and 60 respectively provide pulses 430 and 420 to set the magnetic vectors anti-parallel. Pulses 430 and 420 are of an opposite polarity of pulses 410 and 400. In this example, MTJ cell 200 is being tested for setting the magnetic vector from an anti-parallel to a parallel state. The opposite case, testing for setting the magnetic vector from a parallel state to an anti-parallel state could be performed by inverting the signals provided by pulse generators 50 and 60 and setting counter 100 to increment on a negative voltage transition. Note that pulse 430 has a magnitude that is larger than pulse 410. The larger magnitude of pulse 430 is used to ensure that MTJ cell 200 is set to the anti-parallel state. Pulse 480 transitions to zero volts after MTJ cell 200 is reset indicating that MTJ cell 200 is in a high resistance state (low current sense). If event 310 failed to write the bit, then the bit would remain in the high resistance state, event 320 would have no effect on the bit, and counter 100 would not increment.

In event 330, MTJ cell 200 is programmed to set the magnetic vectors of the device from anti-parallel to parallel. In an embodiment of the test, MTJ cell 200 is not set until pulse 480 has settled to approximately zero volts or the test has stabilized. Pulse generator units 50 and 60 respectively provide pulses 450 and 440 setting the magnetic vectors of MTJ cell 200 parallel to one another (low resistance state). The voltage at the output of current preamp 70 transitions positive towards the maximum voltage in a pulse 490. Counter 100 increments the count when trigger voltage 300 is exceeded as indicated by count 360. Conversely, in a case where the combined magnitude of pulses 440 and 450 are not sufficient to set the magnetic vectors of MTJ cell 200 parallel, counter 100 does not increment.

In event 340, MTJ cell 200 is programmed to set the magnetic vectors of the device from parallel to anti-parallel. As mentioned previously, MTJ cell 200 is not reset until pulse 480 has approximately reached its maximum voltage. Pulse generators units 50 and 60 respectively provide pulses 470 and 460 to set the magnetic vectors anti-parallel. Pulses 470 and 460 are of an opposite polarity as pulses 450 and 440. Once the magnetic vectors are reset anti-parallel to one another, pulse 490 transitions to zero volts. MTJ cell 200 is now ready for another test.

Figure 5:
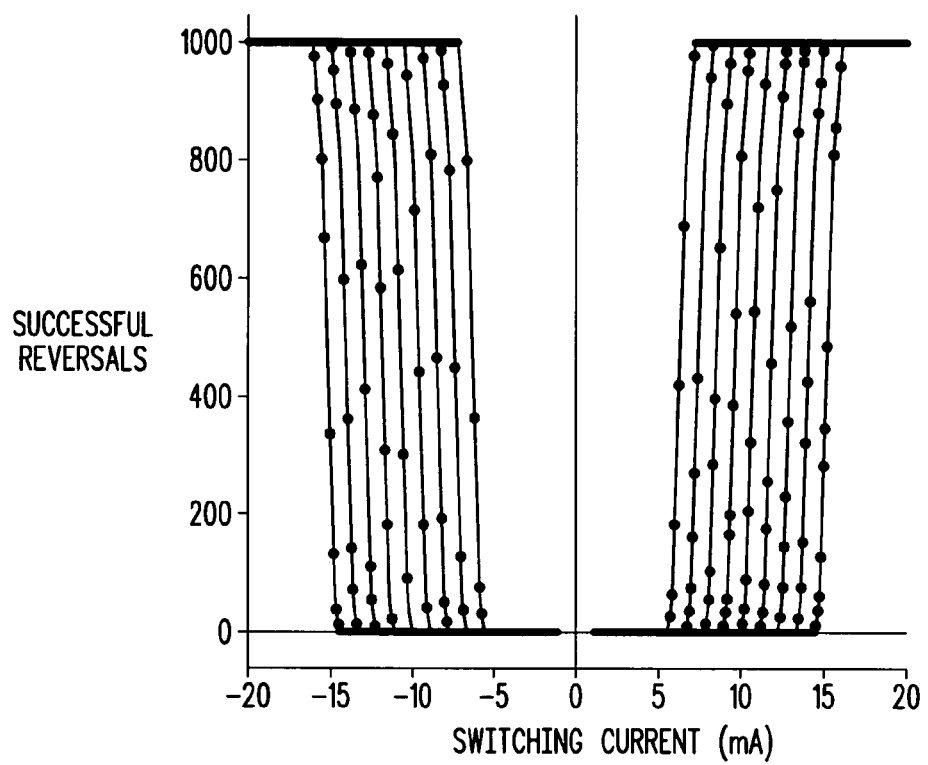
FIG. 5 is a graph of measurements taken by the test apparatus of FIG. 3 corresponding to the number of successful reversals of the logic state of the MTJ cell under different operating conditions.

FIG. 5 is an example of a graph of measurements taken by test apparatus 30 of FIG. 3 corresponding to the number of successful reversals of the logic state of MTJ cell 200 under different operating conditions. The y-axis indicates the number of successful reversals. The x-axis is the magnitude of the current pulses from pulse generator unit 50 used to program MTJ cell 200. Both positive and negative currents are shown for evaluating MTJ cell 200 switching to either logic state. Each trace corresponds to a unique and fixed magnitude of current pulses from PGU 60 while varying the magnitude of current pulses from PGU 50. Each dot along a given trace represents the number of successful writes out of 1,000 attempts for a given combination of current magnitudes from pulse generator units 50 and 60. In the graph, the pulses provided to MTJ cell 200 for programming had a fixed duration of 20 nanoseconds. The traces showing the largest absolute value of switching current from PGU 50 (the outside traces in the plot) correspond to no current being provided by PGU 60. The current from PGU 50 at which the bit switches decreases as the current magnitude output from PGU 60 increases. The graph illustrates that a large number of data points can be taken that generates statistically relevant device operation information. For example, $10^4$-$10^5$ measurements on each bit can be taken in a matter of seconds at a repetition rate of 0.5 MHz.

Figure 6:
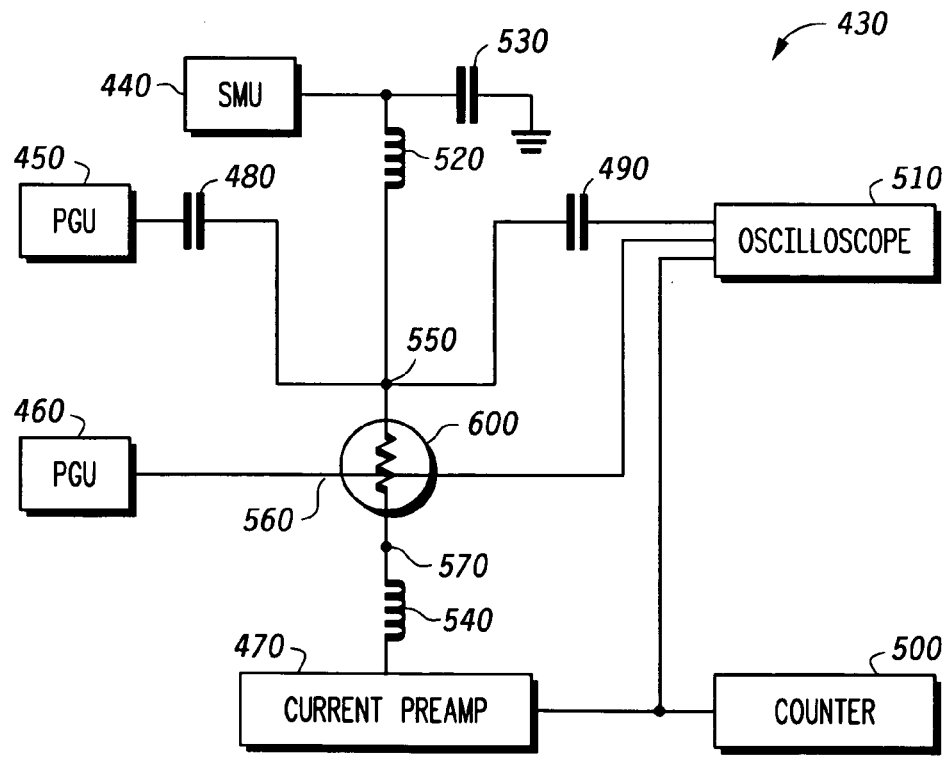
FIG. 6 is a schematic diagram of an alternate test apparatus in accordance with the present invention.

FIG. 6 is a schematic diagram of an alternate test apparatus 430 in accordance with the present invention. Test apparatus 430 comprises a source measure unit (SMU) 440, a pulse generator unit (PGU) 450, a pulse generator unit (PGU) 460, a current preamp 470, a capacitor 480, and a capacitor 490. A device under test or MTJ cell 600 has a terminal 550, a terminal 560, and a terminal 570. Terminal 550 is coupled to a first magnetic layer of MTJ cell 600. In particular, a current pulse is provided to terminal 550 that generates a magnetic field for programming MTJ cell 600. A bias voltage is also applied to terminal 550 that generates a DC current through MTJ cell 600 corresponding to the logic level stored in the device. Terminal 660 is magnetically but not electrically coupled to MTJ cell 600. A current pulse is provided to terminal 660 in conjunction with the current pulse provided to terminal 550. Terminal 570 is coupled to a second magnetic layer of MTJ cell 600. DC current from MTJ cell 600 outputs through terminal 570 to current preamp 470.

Capacitor 480 has a first terminal coupled to an output of pulse generator 450 and a second terminal coupled to terminal 550 of MTJ cell 600. Pulse generator unit 460 has an output coupled to terminal 560 of MTJ cell 600. Current preamp 470 has an input coupled to terminal 570 of MTJ cell 600. Capacitor 490 has a first terminal coupled to terminal 550 of MTJ cell 600 and a second terminal coupled to a first input of oscilloscope 510. Oscilloscope 510 monitors testing of MFJ cell 200.

Source measuring unit 440 couples to terminal 550. A DC current path is formed through the following devices: source measuring unit 440, MTJ cell 600, and current preamp 470. Source measuring unit 440 provides a DC voltage bias on MTJ cell 600. Current preamp 470 acts as a virtual ground to the DC current path. Ideally, the voltage bias across MTJ cell 600 provided by source measuring unit 440 remains constant for either stored logic level and under various test operations of test apparatus 430. In an embodiment of test apparatus 430, the voltage bias on MTJ cell 600 is continuously provided during both read and write operations. The DC voltage bias across MFJ cell 600 is kept at a voltage level that allows safe operation.

Current preamp 470 receives the current corresponding to a logic level stored in MTJ cell 600 and amplifies and converts the current to a detectable signal. An input of counter 580 is coupled to an output of current preamp 470. The trigger level of counter 480 is set to the midpoint between the voltage outputs of current preamp 470 corresponding to the two different logic levels (low and high resistance states) stored in MTJ cell 600. Counter 580 is enabled to increment a count when the output of current preamp 470 transitions through the trigger level. The trigger level can be selected to increment counter 580 for voltage transitions that are positive, negative, or both.

Performance of the circuitry that DC biases MTJ cell 600 is further enhanced by an inductor 520, an inductor 540, and a capacitor 530 as described in FIG. 3. Inductor 520 has first terminal coupled to the output of source measuring unit 440 and a second terminal coupled to node 550. Capacitor 530 has a first terminal coupled to the output of source measuring unit 440 and second terminal coupled to ground. Inductor 540 has a first terminal coupled to terminal 570 and a second terminal coupled to the input of preamp 470.

Pulse generator units 450 and 460 pulse MTJ cell 600 to set a magnetic vector in the free magnetic layer of the device. In particular, pulsing MTJ cell 600 is done in a manner that does not greatly increase the voltage across the device under test. As mentioned previously, MTJ cell 600 has a DC bias voltage across it provided by source measuring unit 440. Pulse generator unit 450 is AC coupled to terminal 550 through capacitor 480. Capacitor 490 couples the pulse to oscilloscope 510. Capacitors 480 and 490 are selected to have high bandwidth and thus allow faster pulse speed than transformers but they do not protect MTJ cell 600 as well as transformers 80 and 90. One method to prevent damage to MTJ cell 600 is to DC bias MTJ cell 600 at a polarity opposite to that of the pulse being provided by pulse generator unit 450.

In general, capacitors 480 and 490 act similar to the transformer pair disclosed in FIG. 3 by isolating the DC bias provided by SMU 440 from PGU 450. They also allow AC current pulses to pass through node 550 that is coupled to MTJ cell 600. Capacitors 480 and 490 provide an AC coupled path for the pulse to minimize changes in the DC bias. As described hereinabove it can be accomplished without damaging the sensitive structure of a magnetic tunneling junction. The current pulsing can be provided at very high speeds that relates to the fast read and write times required for taking large data samples when characterizing MTJ cell 600.

Pulse generator unit 460 provides a pulse concurrently with pulse generator unit 450 to evaluate the effect of the combined pulses and their capability in setting the magnetic vector of the free magnetic layer in MTJ cell 600. Oscilloscope 510 has a second input coupled to the output of pulse generator unit 460 and a third output coupled to the output of current preamp 470. Oscilloscope 510 or an equivalent monitoring device is useful in tracking/data logging/calibrating the input stimulus to the device under test, the logic state stored in the device under test, and the programming of the device under test. It should be noted that oscilloscope 510 does not couple to MTJ cell 600 in a manner that degrades testing of the device.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A test apparatus adapted to electrically contact a first terminal and a third terminal of a magnetoresistive tunnel junction (MTJ), the apparatus being separate from the MTJ and comprising:
    a source measure unit (SMU) having an output, wherein the SMU is adapted to provide a DC bias voltage across the MTJ;
    a current preamp having an input adapted to be electrically coupled to the third terminal of the MTJ for receiving a current corresponding to a resistance of the MTJ;
    a first pulse generator unit having an output, wherein the first pulse generator unit is adapted to provide current pulses for programming the MTJ; and
    a first transformer having a first input electrically coupled to the output of the first pulse generator unit, a first output electrically coupled to the output of the SMU, and a second output adapted to be electrically coupled to the first terminal of the MTJ.

2. The test apparatus as recited in claim 1 wherein said DC bias voltage is provided by said source measure unit during reading and writing to the MTJ.

3. The test apparatus as recited in claim 2 wherein said input of said current preamp is a virtual ground.

4. The test apparatus as recited in claim 1 farther including:
    an inductor having a first terminal coupled to said output of said SMU and a second terminal coupled to the first terminal of the MTJ; and
    a capacitor having a first terminal coupled to said output of said SMU and a second terminal coupled to ground.

5. The test apparatus as recited in claim 4 further including an inductor having a first terminal coupled to the third terminal of the MTJ and a second terminal coupled to said input of said current preamp.

6. The test apparatus as recited in claim 1 further including:
    a second transformer having a first input electrically coupled to said output of said SMU, a second input adapted to be electrically coupled to the first terminal of the MTJ, a first output, and a second output adapted to be electrically coupled to ground.

7. The test apparatus as recited in claim 6 further including an oscilloscope having a first input coupled to said first output of said second transformer, a second input coupled to a second test terminal of the MTJ, and a third input coupled to an output the current preamp.

8. The test apparatus as recited in claim 7 further including a second pulse generator unit having an output that is magnetically coupled to a second terminal of the MTJ.

9. The test apparatus as recited in claim 1 further including a counter coupled to an output of said current preamp.

10. A test apparatus adapted to electrically contact a first terminal and a third terminal of a magnetoresistive tunnel junction (MTJ), the apparatus being separate from the MTJ and comprising:
    a source measure unit (SMU) having an output, wherein the SMU is adapted to provide a DC bias voltage across the MTJ;
    a current preamp having an input adapted to be electrically coupled to the third terminal of the MTJ, wherein the current preamp is adapted to receive a current corresponding to a resistance of the MTJ;
    a first pulse generator unit having an out put, wherein the first pulse generator unit is adapted to provide current pulses for programming the MTJ;
    a first capacitor having a first terminal electrically coupled to said output of said first pulse generator unit and a second terminal adapted to be electrically coupled to the first terminal of the MTJ; and
    a second capacitor having a first terminal and a second terminal, wherein the first terminal of the second capacitor is adapted to be electrically coupled to the first terminal of the MTJ.

11. The test apparatus as recited in claim 10 farther including:
    an oscilloscope having a first input coupled to said second terminal of said second capacitor, a second input coupled to a second terminal of the MTJ, and a third input coupled to an output of said current preamp; and
    a second pulse generator unit having an output coupled to the second terminal of the MTJ.

12. A method for testing a magnetoresistive tunnel junction (MTJ) comprising the steps of:
    electrically contacting a first terminal and a third terminal of the MTJ with a test apparatus that includes a source measure unit (SMU) having an output, a current preamp having an input, and a pulse generator unit having an output;
    providing, at the output of the SMU, a DC bias voltage across the MTJ;
    reading the MTJ by receiving, at the input of the current preamp, a current corresponding to a resistance of the MTJ with said DC bias voltage across the MTJ; and
    writing to the MTJ with said DC bias voltage across the MTJ, wherein writing is performed when the pulse generator unit provides a current pulse at the output of the pulse generator unit.

13. The method of claim 12 further comprising:
repeating said steps of reading and writing to the MTJ;
monitoring the MTJ;

storing data corresponding to operating conditions of the MTJ; and counting successful writes to the MTJ.

14. The method of claim 12 wherein said step of reading the MTJ further includes the step of:

converting said current to a voltage corresponding to said resistance of the MTJ.

15. The method of claim 14 further comprising:

counting each successful write to the MTJ; and monitoring said voltage corresponding to said resistance of the MTJ.

16. The method of claim 12 wherein said step of writing the MTJ with said DC bias voltage across the MTJ further including a step of AC coupling a pulse to the MTJ.

17. The method of claim 16 further comprising a step of using a transformer to couple a pulse to the MTJ.

18. The method of claim 16 further comprising a step of using a capacitor to couple a pulse to the MTJ.

19. A method of insitu testing a magnetoresistive tunnel junction (MTJ) in a manufacturing environment comprising the steps of:

providing a semiconductor wafer having the MTJ;

electrically contacting a first terminal and a third terminal of the MTJ with a test apparatus that includes a source measure unit (SMU) having an output, a current preamp having an input, and a pulse generator unit having an output;

DC biasing the MTJ using the SMU;

writing a logic level to the MTJ, wherein writing is performed when the pulse generator unit provides a current pulse at the output of the pulse generator unit; and reading said logic level stored in the MTJ wherein the MTJ remains DC biased during testing, wherein reading is performed by receiving, at the input of the current preamp, a current corresponding to a resistance of the MTJ.

20. The method of claim 19 further comprising:

AC coupling a current pulse to write to the MTJ;

monitoring the MTJ; and logging data generated during testing of the MTJ.

21. A test apparatus adapted to electrically contact a first terminal and a third terminal of a magnetoresistive tunnel junction (MTJ), the apparatus being separate from the MTJ and comprising:

a source measure unit (SMU) having an output, wherein the SMU is adapted to provide a DC bias voltage across the MTJ;

a current preamp having an input electrically coupled to the third terminal of the MTJ for receiving a current corresponding to a resistance of the MTJ;

a pulse generator unit having an output, wherein the pulse generator unit is adapted to provide current pulses for programming the MTJ; and a circuit element adapted to isolate the DC bias voltage from the SMU from the pulse generator unit, wherein the circuit element has a first input and at least one output, and wherein the first input is electrically coupled to the output of the pulse generator unit, and the at least one output is electrically coupled to the output of the SMU and is further adapted to be electrically coupled to the first terminal of the MTJ.

22. The test apparatus of claim 21, wherein the circuit element comprises:

a first transformer having a first input electrically coupled to the output of the pulse generator unit, and wherein the at least one output comprises a first output and a second output, and wherein the first output is electrically coupled to the output of the SMU and the second output is adapted to be electrically coupled to the first terminal of the MTJ.

23. The test apparatus of claim 21, wherein the circuit element comprises:

a first capacitor having a first terminal electrically coupled to the output of the pulse generator unit and a second terminal adapted to be electrically coupled to the first terminal of the MTJ.

* * * * *

UNITED STATES PATENT AND TRADEMARK OFFICE
CERTIFICATE OF CORRECTION

PATENT NO. : 7,333,360 B2 Page 1 of 1
APPLICATION NO. : 10/746014
DATED : February 19, 2008
INVENTOR(S) : Mark DeHerrera et al.

It is certified that error appears in the above-identified patent and that said Letters Patent is hereby corrected as shown below:

Column 13, line 57, "farther" should be changed to --further--;
Column 14, line 29, "out put" should be changed to --output--;

Signed and Sealed this

Fifteenth Day of July, 2008

JON W. DUDAS
*Director of the United States Patent and Trademark Office*